United States Patent
Knapp et al.

(10) Patent No.: US 7,129,914 B2
(45) Date of Patent: Oct. 31, 2006

(54) ACTIVE MATRIX ELECTROLUMINESCENT DISPLAY DEVICE

(75) Inventors: Alan G Knapp, Crawley (GB); Iain M. Hunter, Brighton (GB)

(73) Assignee: Koninklijke Philips Electronics N. V., Eindhoven (NL)

( * ) Notice: Subject to any disclaimer, the term of this patent is extended or adjusted under 35 U.S.C. 154(b) by 425 days.

(21) Appl. No.: 10/323,240

(22) Filed: Dec. 18, 2002

(65) Prior Publication Data
US 2003/0117348 A1  Jun. 26, 2003

(30) Foreign Application Priority Data
Dec. 20, 2001 (GB) .................. 0130411.2

(51) Int. Cl.
*G09G 3/30* (2006.01)
(52) U.S. Cl. .............. 345/76; 345/36; 345/82
(58) Field of Classification Search ........ 345/76, 345/45, 80, 82, 83, 36, 46, 48, 77; 315/169.1, 315/0.3; 340/815.45
See application file for complete search history.

(56) References Cited
U.S. PATENT DOCUMENTS 5,742,267 A * 4/1998 Wilkinson ............ 345/77
6,400,101 B1 * 6/2002 Biebl et al. ............ 315/291
6,466,188 B1 * 10/2002 Cato ..................... 345/82
6,661,397 B1 * 12/2003 Mikami et al. ........ 345/76
2002/0021096 A1 * 2/2002 Komiya ................ 315/169.1

FOREIGN PATENT DOCUMENTS

| EP | 0717446 | | 6/1996 |
| JP | 09081211 A | * | 3/1997 |
| JP | 11288252 A | * | 10/1999 |
| WO | WO9636959 | | 11/1996 |
| WO | WO0175852 | | 10/2001 |

* cited by examiner

*Primary Examiner*—Richard Hjerpe
*Assistant Examiner*—Jean Lesperance (57) ABSTRACT

An active matrix electroluminescent display device has an array of pixels (10), each pixel having a plurality of current-driven display elements (11a–d), for example comprising organic electroluminescent material, connected in a series arrangement with one another and with drive means (12) operable to control the current through the respective series arrangement. By sub-dividing each pixel in this way, the high voltage drops, that can occur along power supply lines, are reduced thus improving the uniformity of the light outputs from the display elements across the display area.

16 Claims, 5 Drawing Sheets

ACTIVE MATRIX ELECTROLUMINESCENT DISPLAY DEVICE

This invention relates to an active matrix electroluminescent display device comprising a matrix array of pixels, each pixel having a plurality of electroluminescent display elements, and drive means for controlling the current through each of said plurality of display elements in accordance with drive signals applied to the drive means.

Matrix display devices employing electroluminescent, light-emitting, display elements are well known. As for the display elements organic thin film electroluminescent elements and light-emitting diodes (LEDs), comprising traditional III-V semiconductor compounds, have been used. Recent developments in (organic) polymer electroluminescent materials have demonstrated their ability to be used practically for video display purposes and the like. Electroluminescent elements using such materials typically comprise one or more layers of a semiconducting conjugated polymer sandwiched between a pair of (anode and cathode) electrodes, one of which is transparent and the other of which is of a material suitable for injecting holes or electrons into the polymer layer. By suitable choice of the conjugated polymer chain and side chains, it is possible to adjust the band gap, electron affinity and the ionization potential of the polymer. An active layer of such a material can be fabricated using a CVD process or simply by a spin-coating technique using a solution of a soluble conjugated polymer. Through these processes, displays with large light-emitting surfaces can be produced.

Organic electroluminescent materials offer advantages in that they are very efficient and require relatively low (DC) drive voltages. Moreover, in contrast to conventional LCDs, no backlight is required. In a simple matrix display device, the material is provided between sets of row and column address conductors at their intersections thereby forming a row and column array of electroluminescent display elements. By virtue of the diode-like I-V characteristic of the organic electroluminescent display elements, each element is capable of providing both a display and a switching function enabling multiplexed drive operation. However, when driving this simple matrix arrangement on a conventional row at a time scanning basis each display element is driven to emit light for only a small fraction of the overall frame time, corresponding to a row address period. In the case of an array having N rows for example, each display element can emit light for a period equal to f/N at most where f is the frame (field) period. In order then to obtain a desired mean brightness from the display, it is necessary that the peak brightness produced by each element must be at least N times the required mean brightness and the peak display element current will be at least N times the mean current. The resulting high peak currents cause problems, notably with voltage drops and power dissipation caused by the resistance along the row address conductors.

One solution to these problems is to incorporate pixels into an active matrix whereby each pixel comprises a display element and associated address circuitry which is operable to supply a drive current to the display element so as to maintain its light output for a significantly longer period than the row address period. Thus, for example, each pixel circuit is loaded with a (display data) drive signal once per frame period in a respective row address period which drive signal is stored and is effective to maintain a required drive current through the display element for a frame period until the row of pixels concerned is next addressed. This reduces the peak brightness and the peak current required by each display element by a factor of approximately N for a display with N rows. An example of such an active matrix addressed electroluminescent display device is described in EP-A-0717446.

Figure 6:
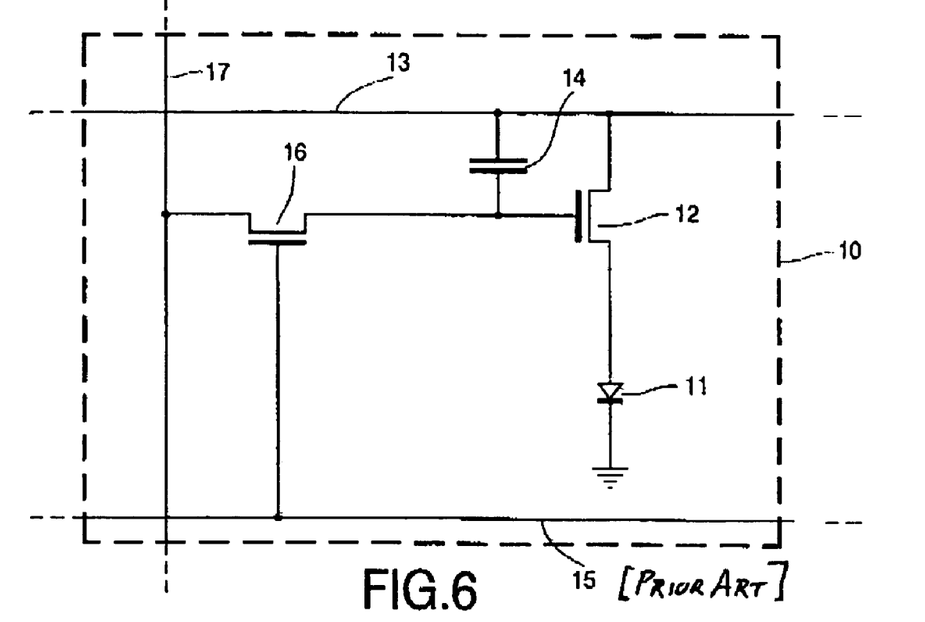
FIG. 6 shows an example pixel in a known active matrix electroluminescent display device.

FIG. 6 shows an example pixel of a conventional active matrix addressed electroluminescent display device. The pixel 10 comprises an LED display element 11. The display element 11 is connected at one end, via the current carrying terminals of a drive transistor 12, to a power line 13 common to all pixels in the same row. The other end of the display element 11 is connected to a common reference potential, for example ground potential. The voltage on the power line 13 is held constant so as to provide a reference potential to one side of a storage capacitor 14. Drive transistor 12 operates to control the current passing through its respective display element 11 thus controlling the brightness. During an address period a selection voltage is applied to selection line 15 in response to a row selection signal from the driver circuitry. This switches on the address transistor 16 allowing a data voltage, applied to a data line 17 in response to a data signal from the driver circuitry, to charge the storage capacitor 14 to the desired voltage. After the address period the selection voltage is removed and address transistor 16 turns off. The data voltage is stored on capacitor 14 for the remaining frame period maintaining this voltage at the gate of the drive transistor 12.

A known problem associated with active matrix electroluminescent display devices addressed in this way is that large voltage drops can occur along each power line. This is due to the large currents that are supplied to the display elements connected to each respective power line. The problem is particularly evident with large area displays because the power lines required are relatively long and the total required current, for a given brightness, is relatively high. Voltage drops produced along the length of the power lines cause variations in the voltage applied to a pixel depending on the location of the pixel in the array. Therefore, for a given drive voltage, the light output of a pixel will depend on the location of the pixel and on the brightness levels of other pixels in the display. Such effects appear as non-uniformity in the displayed image. In addition, the resistance of the power lines causes the current flow therethrough to heat the conductor thereby wasting power. This wasted power is proportional to $I^2R$ where I=Current and R=Resistance.

In order to reduce the effects of these large voltage drops and wasted power, the resistance of the lines can be reduced, for example, by widening them. However, there are practical limitations on this as increasing the width of the conductors reduces the aperture of the pixels and thus the brightness of the output.

Color active matrix electroluminescent displays conventionally comprise a matrix array of color pixels each of which comprises three electroluminescent display elements of the type described above. These will typically emit red, green and blue light respectively. By addressing each of the three color display elements individually each pixel can emit a range of colors. If the display elements are addressed digitally, where each can be either OFF or ON, then eight different colors can be achieved as shown in Table 1. However, if addressed with analogue data signals, where each display element can emit at a range of intensities, then a full color display output can be achieved.

TABLE 1

Output of a digitally addressed color pixel

| Green | Blue | Red | Color pixel Output |
|---|---|---|---|
| OFF | OFF | OFF | Black |
| OFF | ON | OFF | Blue |
| OFF | OFF | ON | Red |
| ON | OFF | OFF | Green |
| ON | ON | OFF | Cyan |
| OFF | PN | ON | Magenta |
| ON | OFF | ON | Yellow |
| ON | ON | ON | White |

Figure 7:
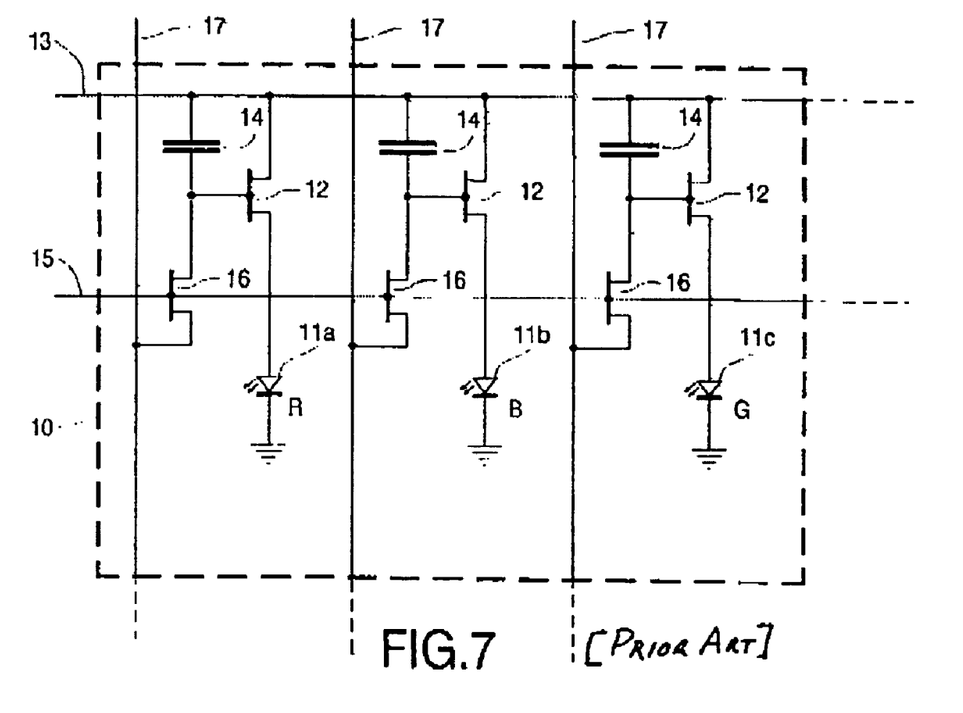
FIG. 7 shows a color pixel in a known active matrix electroluminescent display device.

FIG. 7 shows the address circuitry for an example, conventional color pixel in a color active matrix EL display device. The pixel 10 comprises three separately driven EL display elements 11a, 11b and 11c, of red, blue and green luminance respectively. The operation of the address circuitry associated with each of the display elements is similar to that of FIG. 6. In order to operate as a color display device, each color display element 11a, 11b, 11c, is connected to the power line 13 via the current-carrying terminals of its own drive TFT 12.

In this arrangement, the current passing through each of the display elements 11a, 11b and 11c originates from a single source, i.e. the power line 13. For example, if current j passes through each of display elements 11 at full brightness, then power line 13 must supply current 3×j to each pixel. This exacerbates the voltage drop problem.

It is an object of the present invention to provide an improved active matrix electroluminescent display device.

It is another object of the present invention to provide an active matrix electroluminescent display device in which the maximum current through a power line can be reduced.

According to the present invention, there is provided an active matrix electroluminescent display device of the kind described in the opening paragraph, wherein said plurality of display elements and the drive means of each respective pixel are connected in a series arrangement.

The invention results in a reduction in the voltage drop experienced on a power line in operation of the device.

Each pixel within the display device is provided with a plurality of display elements connected together in series. It may be arranged that the combined outputs of the display elements within a pixel are the same as from a single display element in a conventional pixel arrangement for a given drive signal. However, by connecting a plurality of smaller display elements in series, the current required to drive them for a certain brightness output is reduced. This means that the voltage drops along the power lines, for a given power line dimension and resistivity, are lowered thus reducing the non-uniformity in the displayed image. For example, if each display element draws a current j at full brightness, then the maximum current drawn by each pixel from the power line is j. This is also the maximum current that the drive means will normally have to control. The heating effect caused by the current flow is also reduced thereby reducing the wasted power and thus increasing the efficiency of the device.

In the series arrangement, the display elements are connected together with similar polarity, i.e. by connecting the cathode of a first display element to the anode of the next display element in the series arrangement. Preferably, the display elements are connected in series with one another and the drive means being connected to one end of the series of display elements.

The drive means controls the current j flowing through the series of display elements in accordance with applied drive (data) signals. In this way, the total current, and thus the overall light output intensity, for each pixel can be controlled.

Conveniently, the series arrangement is connected between first and second supply lines. The supply lines may be, for example, a power line which supplies the current to drive the display elements and is held at a substantially constant voltage, and a common line, common to all pixels which is held at a fixed reference potential, for example, ground, as in conventional devices, so as to act as a current drain for the series arrangement.

With the pixels arranged in rows and columns as in conventional active matrix display devices, preferably each row of pixels has an associated selection line and each pixel further comprises an addressing switch which is controlled by the associated selection line in response to an applied row-selection signal during an addressing period. The addressing switch is preferably a transistor whose gate is connected to its respective selection line. Row-selection signals, generated by associated scanning circuitry, are applied to the selection lines. As in conventional display devices, the pixels are preferably addressed a row at a time in sequence.

The respective drive means of a pixel preferably comprises a drive transistor whose gate is connected to an associated data line, via its respective addressing switch, such that a drive signal is applied to the gate during its respective address period. During the addressing period, a drive signal from the data line is transferred to the gate of the drive transistor in the form of a gate voltage. The drive signal may be modified by various drive circuits such as current-mirror circuits or threshold compensation circuits, for example, before being applied to the gate of the drive transistor.

As is customary, each pixel preferably further comprises a capacitance for storing a gate voltage determined by the drive signal at the gate of its respective drive transistor following an address period.

In one preferred embodiment, the display elements in a pixel are of different colors, preferably one each of red, blue and green as in a conventional color display. By controlling the individual intensities of each display element, a color image can be formed on the display device. Thus, each display element in the series arrangement preferably has an associated control means for individually controlling the current flow through it. In operation, each control means controls the current flow through its associated display element within a pixel thus controlling the output color of the pixel.

In this case, preferably, each control means comprises a shunt transistor whose current-carrying terminals are connected in parallel with its respective display element and whose gate is connected to a respective control line, via a control switch which is operable such that a control signal is applied to the gate of the shunt transistor during an address period.

In such a color display device, the color output of each pixel is controlled by the shunt transistors in response to control signals applied to the gate of each shunt transistor. The shunt transistors are thus operable to divert the current, passing through the series arrangement, around their corresponding display elements. For example, and with reference to Table 1, if a yellow output is desired, from a given pixel, the shunt transistor corresponding to the blue display element is switched on so as to divert the current away from that blue display element. This does not significantly affect the output from the red and green display elements.

In this arrangement, the current carrying terminals of the shunt transistors are preferably connected in series between the drive means and a fixed reference potential, preferably the common line.

In the preferred embodiment in which each pixel comprises a plurality of different colored display elements, each column of pixels has a corresponding number of associated control lines in addition to the data line. The drive signal applied to the drive transistor controls the brightness of the pixel output. The control signals applied to the shunt transistors control the color of the pixel output.

Each control switch is preferably a transistor whose gate is connected to the corresponding selection line. Each is switched ON in response to applied row-selection signals on the corresponding selection line during a corresponding address period. Therefore, during this period, the addressing transistor and control transistors are each turned on by a row-selection signal allowing data and control signals to be applied to the gates of the respective drive and shunt transistors.

Preferably the gate of the shunt transistor has an associated capacitance to store a gate voltage determined by the corresponding control signal. When the row-selection signal is removed, the control switch turns off and the gate voltage, set by the control signal and stored on the capacitance, is held on the gate of the corresponding shunt transistor for the remaining frame time and until the next address period.

In another preferred embodiment of the present invention the control signal comprises a digital signal effective to switch the shunt transistor between its OFF state and ON state. A shunt transistor in an OFF state will switch its corresponding display element ON and vice-versa. Therefore, each corresponding display element can be either switched ON or OFF according to a digital drive scheme. For a device made up of red, blue and green display elements, eight different colors can be achieved as shown in Table 1. As before, the drive transistor of each pixel is addressed with an analogue data signal to control the brightness of the respective outputs. Preferably, each of the capacitances associated with the gates of the shunt transistors is connected to a fixed reference potential, for example the common line.

This digital scheme is capable of providing eight different colors employing the permutations shown in Table 1. However, if a full color display is required, an analogue addressing scheme may be applied.

In a further preferred embodiment, therefore, the control signal comprises an analogue signal effective to regulate the current flow through the respective display element within a continuous range of values. In this way the shunt current can be controlled in order to set the output of the display element to a desired level. The shunt transistor acts as a current-source shunt. In this embodiment, a control signal is applied to the gate of the shunt transistor during the address period in a similar manner to the digital scheme described above. However, the current-carrying terminals of the shunt transistor is preferably held at fixed reference potential during the address period. A storage capacitance is connected between the gate and a current-carrying terminal, e.g. the source, of the shunt transistor. This allows direct voltage programming of the shunt transistor. After the addressing period, the storage capacitance retains its respective gate-source voltage.

In yet another preferred embodiment, each pixel comprises a plurality of electroluminescent display elements of the same color output, connected together in series. Each display element may, or may not, have associated control means for individually controlling the current flow through the respective display element.

Embodiments of active matrix electroluminescent display devices in accordance with the invention will now be described, by way of example, with reference to the accompanying drawings, in which:

The figures are merely schematic and have not been drawn to scale. The same reference numbers are used throughout the figures to denote the same or similar parts.

Figure 1:
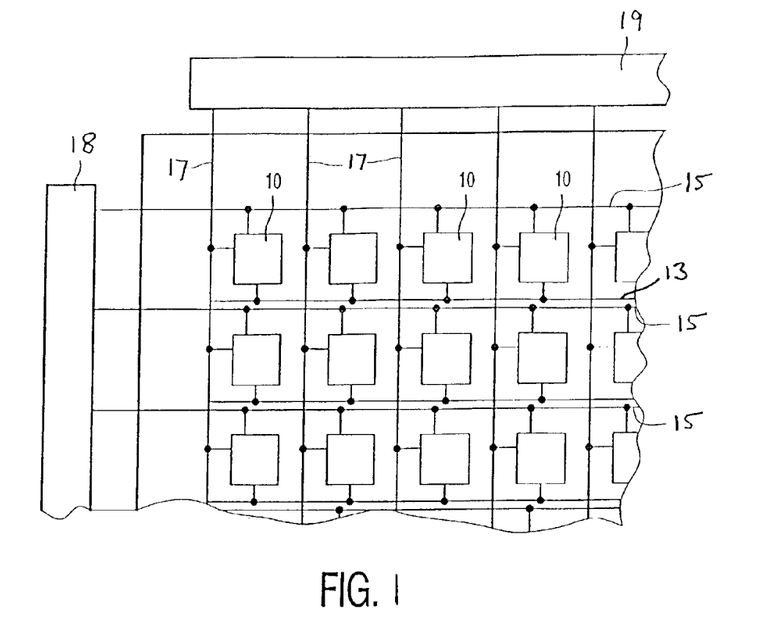
FIG. 1 is a simplified schematic diagram of part of a display device according to the invention.

Referring to FIG. 1, the active matrix electroluminescent display device comprises a panel having a row and column matrix array of regularly-spaced pixels, denoted by the blocks 10, located at the intersections between crossing sets of row (selection) and column (data) conductors, or lines, 15 and 17. Only a few pixels are shown in the Figure for simplicity. In practice there may be several hundred rows and columns of pixels. The pixels 10 are addressed via the sets of selection and data lines, 15 and 17, by a peripheral drive circuit comprising a row, scanning, driver circuit 18 and a column, data, driver circuit 19 connected to the ends of the respective sets of conductors.

Each row of pixels is addressed in turn in a frame period by means of a selection signal applied by the circuit 18 to the relevant row conductor 15 so as to load the pixels of the row with respective data signals, determining their individual display outputs in a frame period following the address period, according to the respective data signals supplied in parallel by the circuit 19 to the column conductors. As each row is addressed, the data signals are supplied by the circuit 19 in appropriate synchronization.

General construction and operational aspects of the device are similar in certain aspects to those of the device described in EP-A-0717446 where discussion in these respects is incorporated herein by reference material.

Figure 2:
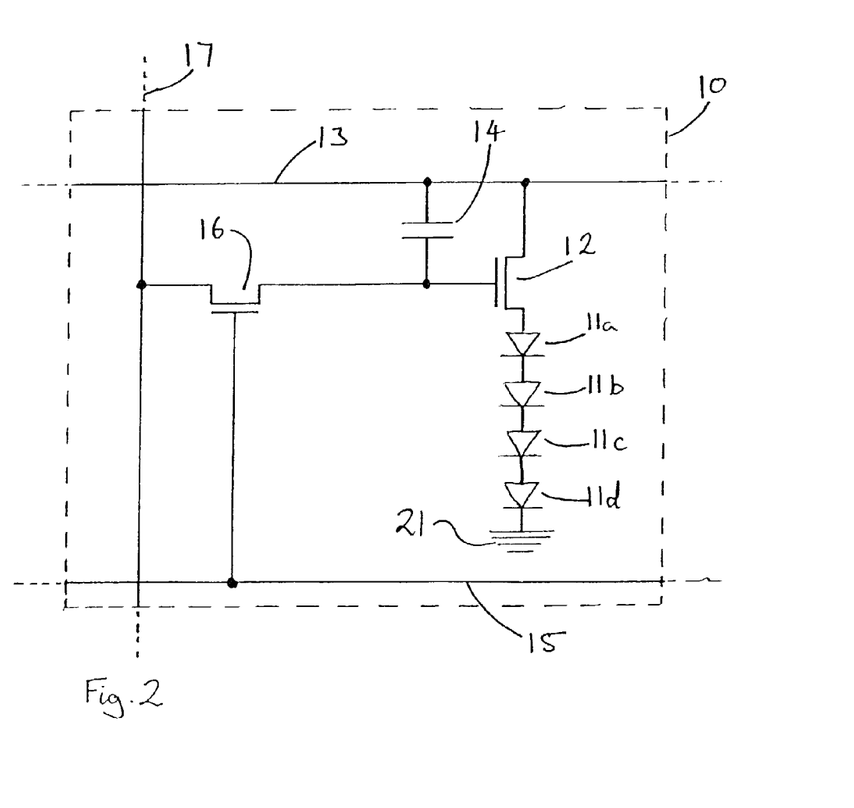
FIG. 2 shows a pixel circuit in accordance with a first embodiment of the present invention.

FIG. 2 shows a pixel circuit in accordance with a first embodiment of the present invention. The pixel 10 comprises four electroluminescent display elements, 11a, 11b, 11c and 11d, having the same color output, which are connected with similar polarity in a series arrangement. The cathode of one display element is connected to the anode of the next display element in the series arrangement.

Figure 8:
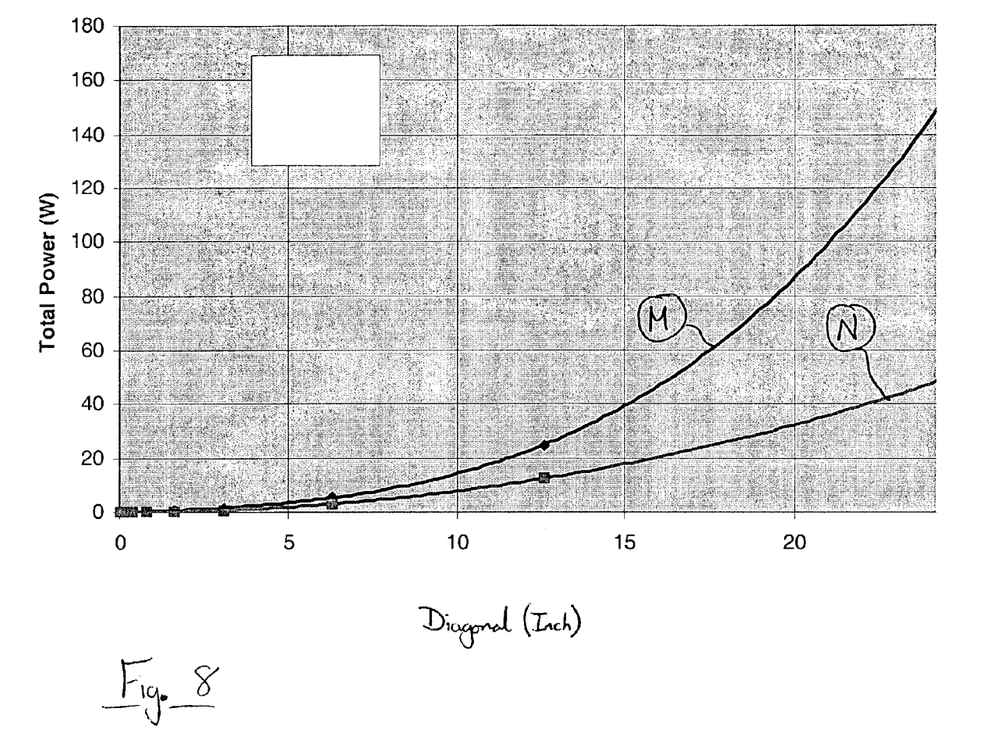
FIG. 8 shows a graph of two plots comparing the power consumption of a display device, according to the invention to a known display device.

Because the pixel is sub-divided into a plurality of series connected display elements, the current required to drive the pixel is less than that of a pixel having an equivalently sized single display element. This reduces the significant voltage drops that can otherwise occur along the power lines thus reducing non-uniformities in the displayed image. The power consumption of the device is also reduced as shown by the graph of FIG. 8. This shows plots of total power consumption against display size for a computer model of two active matrix electroluminescent display devices. Plot M shows the power consumption of a known display device and which power can be seen to rise significantly for larger display sizes. Plot N relates, however, to a display device comprising the pixel circuit of FIG. 2 in which four electroluminescent display elements are connected in series. It can be seen, especially for large displays (having long power lines), the significant reduction in power consumption with this kind of arrangement.

Referring again to FIG. 2, each electroluminescent display element 11a–11d comprises an organic light emitting diode, represented here as a diode element (LED) and comprising a pair of electrodes between which one or more active layers of organic electroluminescent material is sandwiched. The display elements of the array are carried together with the associated active matrix circuitry on one side of an insulating support and arranged on the support laterally with respect to one another. Either the cathodes or the anodes of the display elements are formed of transparent conductive material. The support may be of a transparent material such as glass and the electrodes of the display elements 11 closest to the substrate may consist of a transparent conductive material such as ITO so that light generated by the electroluminescent layer is transmitted through these electrodes and the support so as to be visible to a viewer at the other side of the support. Alternatively, the light output could be viewed from above the panel where the electrode remote from the support would comprise a thin, transparent, conductive layer formed of, for example ITO or a metal having a low work function such as calcium or a magnesium:silver alloy. The electrode adjacent the support would comprise a metal having a low work function or a reflective, conductive material. Typically, the thickness of the organic electroluminescent material layer is between 100 nm and 200 nm. Typical examples of suitable organic electroluminescent materials which can be used for the elements 11 are described in EP-A-0 717446. Electroluminescent materials such as conjugated polymer materials described in WO96/36959 can also be used.

The series arrangement comprising the display elements includes a drive transistor 12 connected, at its drain, to one end display element, 11a. The other end of the series arrangement is connected to a common line 21 which in practice comprises, for example, an electrode layer (cathode) layer common to all pixels. This provides a constant reference voltage and acts as a current drain. It is typically fixed at ground potential. The source of the drive transistor 12 is connected to a power line 13 common to other pixels in the same row (as shown in FIG. 1). A capacitance 14 is connected between the gate and the source of the drive transistor 12. An associated selection line 15 is connected to the gate of an addressing transistor 16. The source of the addressing transistor 16 is connected to an associated data (column) line 17. The drain of the addressing transistor 16 is connected to the gate of the drive transistor 12.

Alternatively, the series arrangement may comprise the drive transistor connected between the cathode of the display element 11c, at the other end of the series, and the common line 21. As a further alternative, the drive transistor may be connected, in series, between two display elements.

The operation of the pixel circuit of FIG. 2 will now be described. During a row address period a row-selection signal is applied, by the circuit 18, to the selection line 15. This is in the form of a voltage pulse that selects all pixels in the row associated with that select line. This signal provides a voltage to the gate of the addressing transistor 16 thus turning it on. This allows a drive signal to be supplied from the data line 17 to the gate of the drive transistor 12.

The desired brightness of the pixel output is set by an analogue drive (data) signal which is applied to the data line 17, by the circuit 19, during the address period. The drive signal produces a voltage on the gate of the drive transistor 12. The gate voltage determines the level of current that flows from the power line 13 to the series arrangement of display elements 11, and thus their output brightness. During the address period the capacitance 14 is charged so as to store the source-gate voltage present on the drive transistor 12. The capacitance then serves to maintain this gate voltage following the address period for the remainder of the frame period until the row of pixels is next addressed.

Each row of pixels is addressed in turn in this manner in sequence and in respective row address periods so as to load the pixels of each row with their respective drive signals and set the pixels to provide desired display outputs during the subsequent drive period, corresponding approximately to a frame period, until they are next addressed.

Although the pixel circuit of FIG. 2 comprises four series connected display elements, 11a–d, it is envisaged that the invention is also applicable to pixels having any practical number of series connected display elements.

The transistors, 12 and 16, shown in FIG. 2 are of n-type conductivity. Alternatively, p-type TFTs may be used with the circuit and drive signals being adjusted accordingly.

Figure 3:
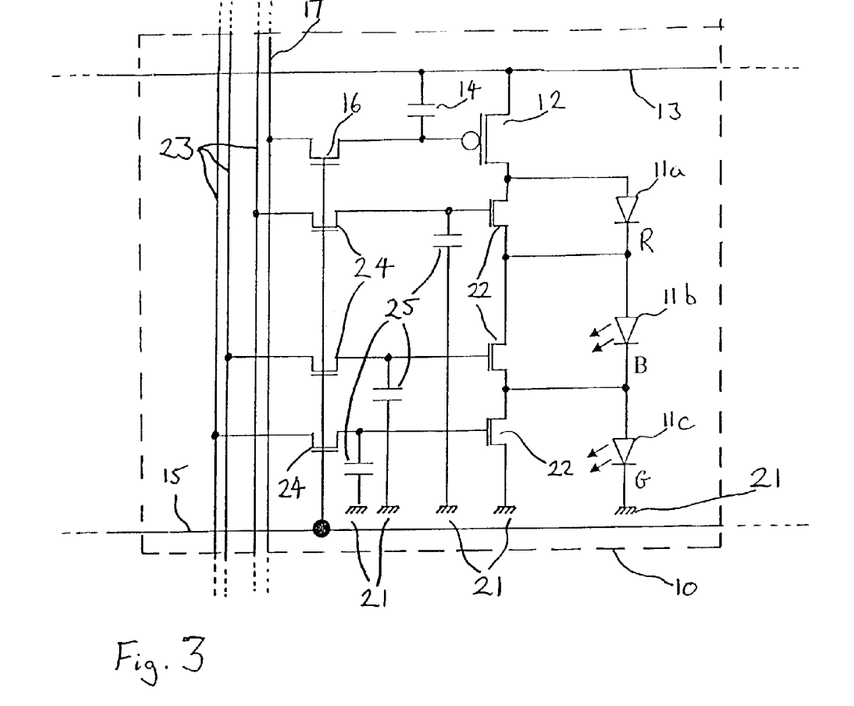
FIG. 3 shows a color pixel circuit in accordance with a second embodiment of the present invention.

FIG. 3 shows a color pixel circuit in accordance with a second embodiment of the present invention. The pixel 10 comprises three display elements, 11a, 11b and 11c, connected in series with one another and again arranged laterally adjacent one another on a support. Each display element 11a–c emits light of a different color, one each of red, blue and green.

As before, the current carrying terminals of a drive transistor 12 are connected in series with the display elements 11a–c between a power line 13 and a common line 21. The drive transistor 12 is connected between the power line 13 and the anode of an end display element 11a in the series. The gate of the drive transistor 12 is connected to an associated data line 17 via an addressing transistor 16. The gate of addressing transistor 16 is connected to an associated selection line 15. A capacitance 14 is arranged to store the gate-source voltage of the drive transistor 17.

Each display element 11a–c within the pixel 10 has an associated control means for individually controlling the current flow through its associated display element. In this embodiment, the control means comprises a shunt transistor 22, preferably a thin-film transistor fabricated on the display substrate. The source and drain of each shunt transistor 22 is connected in parallel with its associated display element 11. The gate of each shunt transistor 22 is connected to an associated, individual, control line 23 via the current-carrying terminals of an associated control transistor 24. Therefore, a pixel 10 having three display elements 11, as in this case, has four associated column lines: three control and one data, 23 and 17. The gates of the control transistors 24 are all connected to the associated selection line 15. The gate of each shunt transistor 22 is also connected to the common line 21 via a respective capacitance 25.

The operation of the pixel circuit of FIG. 3 will now be described. During a row address period a row-selection signal is applied to the selection line 15. This is in the form of a voltage pulse that selects all pixels in the row associated with that selection line. This signal provides a voltage on the gate of each addressing and control transistor, 16 and 24, thus turning it on. This allows drive and control signals to be supplied from the data line and control lines, 17 and 23, to the gates of the drive and shunt transistors, 12 and 22 respectively.

The desired brightness of the pixel output is set by the drive signal which is applied to the data line 17 during the address period. The drive signal provides a voltage on the gate of the drive transistor 12. The gate voltage determines the level of current that flows from the power line 13 and through the series arrangement. During the address period the capacitance 14 charges so as to store the source-gate voltage present on the drive transistor 12.

The desired color of the pixel output is set by the control signals which are applied to the control lines 23 during each address period. For example, and with reference to Table 1, for a pixel with red, green and blue emitting display elements, if there is no current flow through any of the display elements within the pixel then it will appear black. If the maximum current flows through the red display element and the green display element, but no current flows through the blue display element then the pixel will appear yellow.

In this embodiment, the control signals are digital in nature. Each control signal provides a voltage on the gate of its associated shunt transistor 22. This either sets the shunt transistor 22 to an OFF state or an ON state in accordance with the digital signal. The gate voltage set by each digital control signal is stored on the associated capacitance 25 following the address period and for the remainder of the frame period.

When a shunt transistor 22 is in the OFF state, the current shunted away from the associated display element 11 is low and so current will flow through the display element causing it to illuminate. In the ON state, the current is diverted from the associated display element and so the display element will not illuminate. The color of the pixel output may be set by illuminating different permutations and combinations of the three differently colored display elements 11a–c in accordance with the data from Table 1.

The embodiment described above with reference to FIG. 3 concerns a color display in which the color information supplied to the pixels is of a digital nature. Eight different colors, or hues, of varying degrees of brightness may be achieved from each pixel output. To provide a full-color display, in which a full range of hues can be achieved, it is convenient for an analogue addressing scheme to be used. This requires some modifications to the circuit described above.

Figure 4:
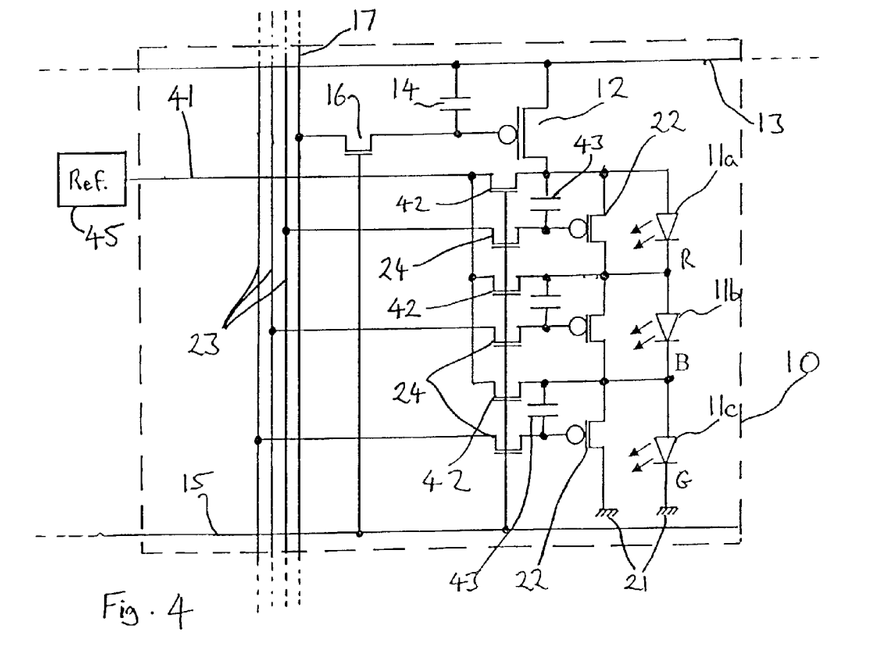
FIG. 4 shows a color pixel circuit in accordance with a third embodiment of the present invention.

FIG. 4 shows a color pixel circuit in accordance with a third embodiment of the present invention. The pixel 10 again comprises three display elements, 11a, 11b and 11c, connected in a series arrangement with one another and the drive transistor 12. The drive transistor 12 is arranged in a similar way to that of the embodiments described above in which it receives drive signals from the circuit 19 via an associated data line 17 and the current carrying terminals of an addressing transistor 16.

As before, each display element 11a14 c within the pixel 10 has an associated control means for individually controlling the current flow through its associated display element. The control means comprises a shunt transistor 22, preferably a thin-film transistor fabricated on the display substrate. The source and drain of each shunt transistor 22 is connected in parallel with its associated display element 11. The gate of each shunt transistor 22 is connected to an associated, individual, control line 23 via the current-carrying terminals of an associated control transistor 24. The gates of the control transistors 24 are all connected to the associated selection line 15.

The source of each shunt transistor 22 is connected to an electrode 41 via the current-carrying terminals of a respective transistor 42. The gate of each transistor 42 is connected to the selection line 15. The electrode 41 is connected to a constant reference voltage. A respective capacitance 43 is connected between the source and gate of each shunt transistor 22.

The operation of the pixel circuit of FIG. 4 will now be described. During a row address period a row-selection signal is applied by the circuit 18 to the selection line 15. This is in the form of a voltage pulse that selects all pixels in the row associated with that selection line. This signal provides a voltage on the gates of the addressing and control transistors, 16 and 24, thus turning them on. This allows drive signals to be supplied from the data line and control lines, 17 and 23 respectively, to the gates of the drive and shunt transistors, 12 and 22 respectively.

During the addressing period, the row-selection signal is also applied to the gates of the transistor 42, thus turning it on. This allows a constant reference voltage from an external source 45 connected to the electrode 41 to be applied to the source of each shunt transistor 22. Therefore, direct voltage programming of the shunt transistors can be achieved.

The desired brightness of the pixel output is set by the drive (data) signal which is applied to the data line 17 during the address period. The drive signal provides a voltage on the gate of the drive transistor 12. The gate voltage determines the level of current that flows from the power line 13 and through the series arrangement. During the address period the capacitance 14 charges so as to store the source-gate voltage present on the drive transistor 12.

The desired color of the pixel output is set by the control signals which are applied to the control lines 23 by circuit 19 during the address period. In this embodiment, the control signals are of analogue form. Each control signal results in a voltage on the gate of its associated shunt transistor 22, thus programming the desired gate-source voltage. This voltage is stored on the associated capacitance 43 after the address period and for the remaining frame time until the pixel is next addressed.

In this embodiment, each shunt transistor 22 together with its associated capacitance 43 acts as a current source. The shunt transistor gate-source voltage can be set within a finite range of voltages. This is in contrast to the embodiment of FIG. 3 in which each shunt transistor can either be in an OFF-state or an ON-state. Therefore, a full range of hues can conveniently be achieved for the output of the color pixel.

Although the embodiments having individual control means for each display element comprise display elements having different colored outputs, it is envisaged that each pixel may comprise display elements having outputs of the same color.

The transistors (addressing, control, drive and shunt) are preferably formed as TFTs on a substrate of glass or other insulating material together with the address lines (selection, data and control) using standard thin film deposition and patterning processes as used in the field of active matrix display devices and other large area electronic devices. It is envisaged however, that, the active matrix circuitry of the device may be fabricated using IC technology with a semiconductor substrate.

Although particular transistors shown in the Figures are of p-type or n-type conductivity, it will be apparent to those skilled in the art that arrangements using the conductivity types opposite to those shown may also be used, with appropriate alteration to the voltages employed. Likewise, it should be apparent to those skilled in the art that other pixel drive circuits to those described can be used such as those incorporating current mirror circuits and threshold voltage compensation circuits as described in WO01/75852 for example.

Figure 5:
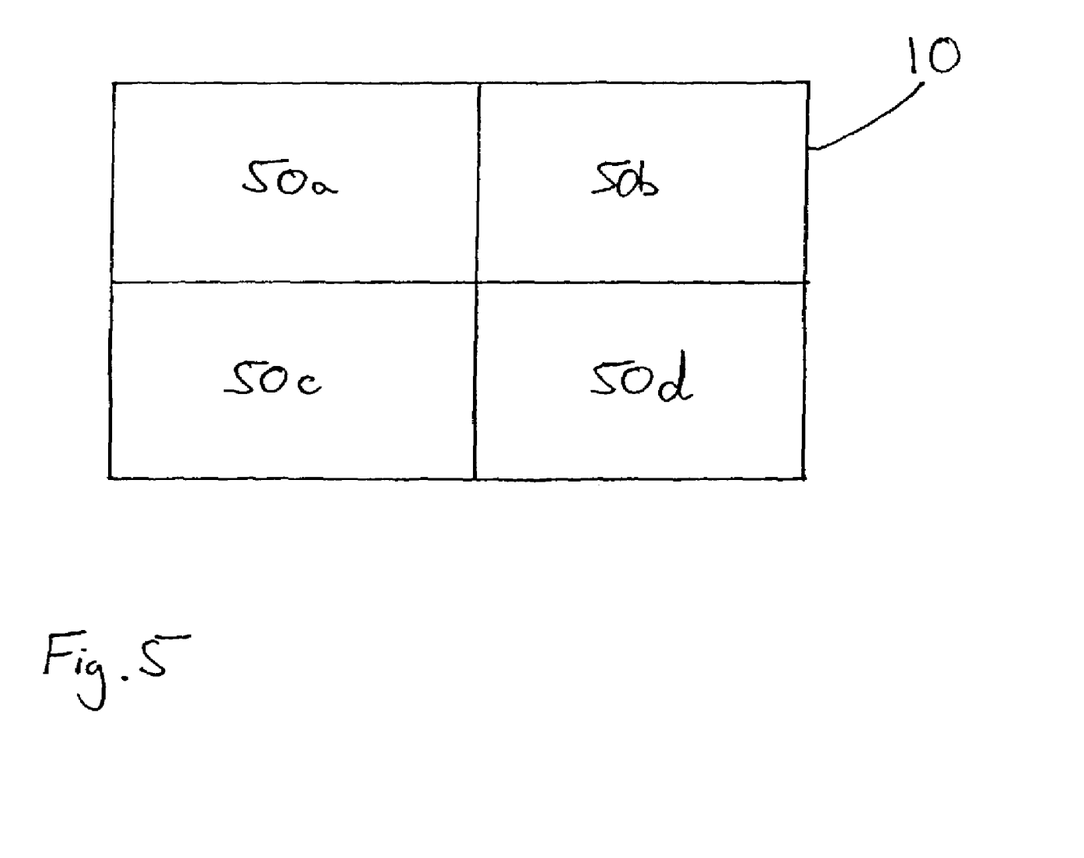
FIG. 5 is a schematic diagram of the layout of display elements within an example pixel.

FIG. 5 is a schematic diagram of the layout of display elements within an example pixel 10 of one embodiment comprising pixels having four display elements. The area of the pixel 10 in the display device is sub-divided such that each individual display element in the series arrangement illuminates a respective one of the areas 50a–50d. The sub-divided areas are of similar size to one another. Although FIG. 5 shows a pixel split into four separate regions, it is envisaged that pixels may be separated into any practical number of regions through a corresponding number of display elements. For example, a color pixel is typically formed having three regions, one each of red, blue and green display elements.

In summary, an active matrix electroluminescent display device has a matrix array of pixels. Each pixel has a plurality of electroluminescent display elements and drive means for controlling the current through each of the plurality of display elements in accordance with applied drive signals. The plurality of display elements in each pixel and the drive means are connected 10 in a series arrangement. The current required to drive a pixel at a given brightness is therefore reduced thus reducing the voltage drops that occur along the power lines and the consequential display non-uniformities. The device may comprise a monochrome display or a color display. The current through the individual display elements in the series arrangement may be controlled separately by associated control means.

From reading the present disclosure, other modifications will be apparent to persons skilled in the art. Such modifications may involve other features which are already known in the field of active matrix electroluminescent display devices and component parts thereof and which may be used instead of or in addition to features already described herein.

The invention claimed is:

1. An active matrix electroluminescent display device comprising:
   a matrix array of pixels, each pixel including
      a plurality of electroluminescent display elements that are connected in series with each other, and
      a driver that is configured to control current through each of the plurality of display elements in accordance with drive signals applied to the driver,
   wherein
   the plurality of display elements and the driver of each pixel are connected in a series arrangement.

2. The active matrix electroluminescent display device of claim 1, wherein the series arrangement is connected between first and second supply lines.

3. The active matrix electroluminescent display device of claim 1, wherein:
   the pixels are arranged in rows and columns,
   each row of pixels includes an associated selection line and
   each column of pixels includes an associated data line,
   each pixel includes an addressing switch that is controlled by the associated selection line in response to an applied row-selection signal during an address period.

4. The active matrix electroluminescent display device of claim 3, wherein each driver comprises a drive transistor whose gate is connected to its associated data line, via its respective addressing switch, such that a drive signal is applied to the gate during its respective address period.

5. The active matrix electroluminescent display device of claim 4, wherein the drive signal is modified before being applied to the gate.

6. The active matrix electroluminescent display device of claim 4, wherein each pixel includes a capacitance for storing a gate voltage determined by the drive signal at the gate of its respective drive transistor following an address period.

7. The active matrix electroluminescent display device of claim 1, wherein each display element in the series arrangement includes an associated controller that is configured to control the current flow through the respective display element.

8. The active matrix electroluminescent display device of claim 7, wherein each control means includes a shunt transistor that includes current-carrying terminals that are connected in parallel with its respective display element and a gate that is connected to a respective control line via a control switch that is operable such that a control signal is applied to the gate of the shunt transistor during an address period.

9. The active matrix electroluminescent display device of claim 7, wherein each pixel includes three electroluminescent display elements, each of a different color output.

10. The active matrix electroluminescent display device of claim 8, wherein the gate of the shunt transistor includes an associated capacitance to store a gate voltage determined by the corresponding control signal.

11. The active matrix electroluminescent display device of claim 8, wherein said control signal includes an analogue signal effective to regulate current flow through the respective display element within a continuous range of values.

12. The active matrix electroluminescent display device of claim 11, wherein the current-carrying terminals of the shunt transistor are held at a fixed reference potential during the address period.

13. The active matrix electroluminescent display device of claim 10, wherein each of the capacitances associated with the gates of the shunt transistors is connected to a fixed reference potential.

14. The active matrix electroluminescent display device of claim 10, wherein the control signal includes a digital signal effective to switch the shunt transistor between an OFF state and an ON state.

15. The active matrix electroluminescent display device of claim 10, wherein each of the capacitances associated with the gates of the shunt transistors is connected between the gate and a current-carrying terminal of their respective shunt transistors.

16. The active matrix electroluminescent display device of claim 1, wherein the plurality of electroluminescent display elements are of the same color output.

* * * * *